United States Patent [19]
Ohira

[11] Patent Number: 5,416,747
[45] Date of Patent: May 16, 1995

[54] SEMICONDUCTOR MEMORY DRIVEN AT LOW VOLTAGE

[75] Inventor: Tsuyoshi Ohira, Chiba, Japan

[73] Assignee: Kawasaki Steel Corporation, Kobe, Japan

[21] Appl. No.: 89,106

[22] Filed: Jul. 12, 1993

[30] Foreign Application Priority Data

Jul. 15, 1992 [JP] Japan ................................. 4-188190

[51] Int. Cl.⁶ .............................................. G11C 8/00
[52] U.S. Cl. ........................... 365/230.06; 365/189.09; 365/189.11
[58] Field of Search .................... 365/230.06, 189.11, 365/189.09, 204; 307/449

[56] References Cited

U.S. PATENT DOCUMENTS

| | | | |
|---|---|---|---|
| 5,051,959 | 9/1991 | Nakano et al. | 365/230.06 |
| 5,119,334 | 6/1992 | Fujii | 365/189.11 |
| 5,257,238 | 10/1993 | Lee et al. | 365/230.06 |

Primary Examiner—Joseph A. Popek
Assistant Examiner—Vu Le
Attorney, Agent, or Firm—Oliff & Berridge

[57] ABSTRACT

The signal levels of a plurality of word lines (high and low) are controlled by outputs of upper address decoders and a lower address decoder. Each of the upper address decoders, when it is selected, supplies a word line control signal from the lower address decoder to all the word lines. The word line control signal is used to supply a high voltage only to one word line and a ground potential to other word lines. On the other hand, when the upper address decoder is not selected, it supplies a nonselection level voltage from a low voltage generator. This voltage is lower than the ground potential. Thus, the voltage is applied to the gates of transfer gates connected to the word lines, thereby suppressing a subthreshold current to a small value, thereby decreasing a leakage current from memory cells.

11 Claims, 5 Drawing Sheets

SEMICONDUCTOR MEMORY DRIVEN AT LOW VOLTAGE

BACKGROUND OF THE INVENTION

1. Field of the Invention

This invention relates to semiconductor memories such as a dynamic random access memory (DRAM) and static random access memory (SRAM) and more particularly to semiconductor memories appropriate for driving at low voltage.

2. Description of the Related Art

Formerly, the supply voltage of a digital integrated circuit such as a semiconductor memory was generally 5 volts.

However, as the semiconductor technologies develop, miniaturization of devices advances and the integration degree of semiconductor integrated circuits increases. Thus, if the supply voltage remains 5 volts, trouble such as deterioration caused by hot carriers or the lower breakdown voltage of gate oxide films is prone to occur in miniaturized devices, and it becomes difficult to guarantee reliability. There have been strong demands among the users of such semiconductor memories for a lowering of the power consumption for low power consumption of machines on which the memories are mounted. For this reason, low supply voltages such as 3.3 and 2.7 volts have been proposed.

When the supply voltage is lowered, the threshold voltage Vth for determining the on or off state of a transistor must also be lowered accordingly. This is because if the supply voltage is lowered with Vth remaining as high as before, the transistor driving capability is lowered, leading to degraded performance such as reduced operation speed.

To attempt lowering of the supply voltage without degrading the performance of a semiconductor integrated circuit, Vth of each transistor must be lowered as described above. However, if Vth is lowered, leakage current, when the transistor is turned off, increases. The graph shown in FIG. 1 shows a characteristic of subthreshold current of a MOS transistor, which is one leakage current source vs gate voltage (subthreshold characteristic). The subthreshold characteristic means a drain current value when the gate voltage is Vth or less. In the graph, the horizontal axis is the gate voltage VGS and the vertical axis is the drain current ids. In the example, Vth is defined as the gate voltage VGS when the drain current $I_{DS}$ is $10^{-7}$ A. In FIG. 1, the line indicated by A is one example of the subthreshold characteristic graph of a transistor used with a semiconductor integrated circuit operating at 5 volts, the conventional supply voltage. Vth is set to 0.8 volts. On the other hand, the line indicated by B in FIG. 1 is the subthreshold characteristic graph of a transistor used with a semiconductor integrated circuit where the supply voltage is lowered to 3.3 volts, and Vth is set to 0.5 volts.

Thus, if Vth lowers, the drain current $I_{DS}$ at the turn off point, namely, the subthreshold current when the gate voltage VGS is 0 volts increases from $10^{-15}$ A to $10^{-12}$ A as seen in the graph. This causes the following problems to occur with a semiconductor memory:

FIG. 2 shows a circuit diagram of memory cells of a dynamic random access memory. In the dynamic random access memory, a memory cell 10 holding a storage data is made of a capacitor; one end is connected to a fixed potential, such as ½ Vcc or Vss (ground potential), and another end is connected via a transfer gate 12 to a bit line 14. A gate terminal of the transfer gate 12 is connected to a word line 16. Therefore, if the subthreshold current of the transfer gate 12 increases, it causes leakage current to flow, and even if the word line 16 is low, leakage current of the memory cell 10 charge to the bit line increases. Therefore, the discharge of the memory cell 10 is accelerated and the necessary refresh time cannot be satisfied.

FIG. 3 shows a circuit diagram of a memory cell of a static random access memory. In the static random access memory, a memory cell holding a data is a flip-flop 20, thus the refresh trouble as in the dynamic random access memory does not occur. However, as shown in FIG. 3, a pair of bit lines (BL and $\overline{BL}$) are connected via transfer gates 22 to a pair of output terminals of the flip-flop 20. Thus, as Vth lowers, leakage current increases, and since load resistors 24 are high resistance, the current supply capability is low and the output potential of the flip-flop 20 lowers. When the output potential of the flip-flop 20 lowers, a probability increases rapidly that information stored in the memory cell (flip-flop 20) will be destroyed by irradiation of α particles which also occur at the normal operation mode. If an attempt is made to decrease the resistance values of the two load resistors shown in FIG. 5 compared with the former values, as a solution to this problem, power consumption in the standby mode will increase.

SUMMARY OF THE INVENTION

Accordingly, it is an object of the invention to provide a semiconductor memory intended for operation at low supply voltage without degrading performance by suppressing leakage current to a small value even if Vth lowers.

To this end, according to the invention, there is provided a semiconductor memory being responsive to an address signal for controlling potentials of a plurality of word lines for controlling an access to the memory, the semiconductor memory comprising:

(a) a plurality of transfer gates being connected to each of the word lines, wherein if a signal on a word line is a selection level voltage, the transfer gates connected to the word line are turned on and if it is a nonselection level voltage, the transfer gates connected to the word line are turned off;

(b) a plurality of memory element each being connected to each of the transfer gates, wherein the state of each of the memory element is controlled by the transfer gate to which the memory element is connected;

(c) means for generating the selection level voltage;

(d) means for generating the nonselection level voltage, wherein the nonselection level is a voltage lower than a ground potential; and (e) a decoder means for supplying the selection level voltage to the word line specified by the address signal and the nonselection level voltage to other word lines.

Since the nonselection level generation means generates a voltage lower than the ground potential, the voltage lower than the ground potential is supplied to the word lines not specified by the address signal. Therefore, the leakage current via the transfer gates can be suppressed to a small value and performance such as speed can be prevented from being degraded in the semiconductor memory operating at the low supply voltage; as a result, a semiconductor memory with a small consumption current can be provided.

Since the leakage current is small, a dynamic random access memory driven at low voltage having a long refresh cycle can be provided.

Further, since the leakage current is small, the output of the flip-flop keep Vcc level and a static random access memory driven at low voltage having a low probability that data will be destroyed by a particles, etc., can be provided. In this case, since the leakage current can be made small, the load resistance can be raised. As a result, the cell current can be made small, thus the current in the standby mode can be made small.

Preferably, the supply voltage of the semiconductor memory is a low voltage lower than the supply voltage used with a conventional semiconductor memory by a predetermined potential. For example, although the conventional power supply potential is 5 V, a low voltage of about 3.3 V can be used in the embodiment, thereby making it unlikely that adverse effect of miniaturization of devices will occur and facilitating high integration.

Preferably, in the invention, a threshold voltage of a transistor as a transfer gate is set lower than that of a transistor as a transfer gate used with a conventional semiconductor memory. Particularly, it is preferable that the nonselection level voltage is set to a voltage lower than the ground potential by a voltage corresponding to a drop value of the threshold voltage of the transfer gate, thereby making the subthreshold current of the transfer gate similar to that of a transfer gate in a conventional memory.

Preferably, the decoder means includes a plurality of word decoders and a lower address pre-decoder. The lower address pre-decoder supplies the selection level voltage to a word line control signal line corresponding to a word line selected according to lower bits of the address signal and supplies the ground potential to other word line control signal lines. Each of the word decoders, when it is selected according to predetermined bits of the address signal, supplies a voltage to the word decoder to select a signal from the lower address pre-decoder and select word lines, when it is not selected, the nonselection level voltage is supplied to the word lines.

As a whole, the amplitudes of the word lines are suppressed and the operation can be accelerated. Since the upper address decoders not selected maintain their corresponding word lines at the nonselection level voltage, leakage current can be made small.

DESCRIPTION OF THE PREFERRED EMBODIMENTS

Referring now to the accompanying drawings, there is shown a preferred embodiment of the invention.

Figure 4:
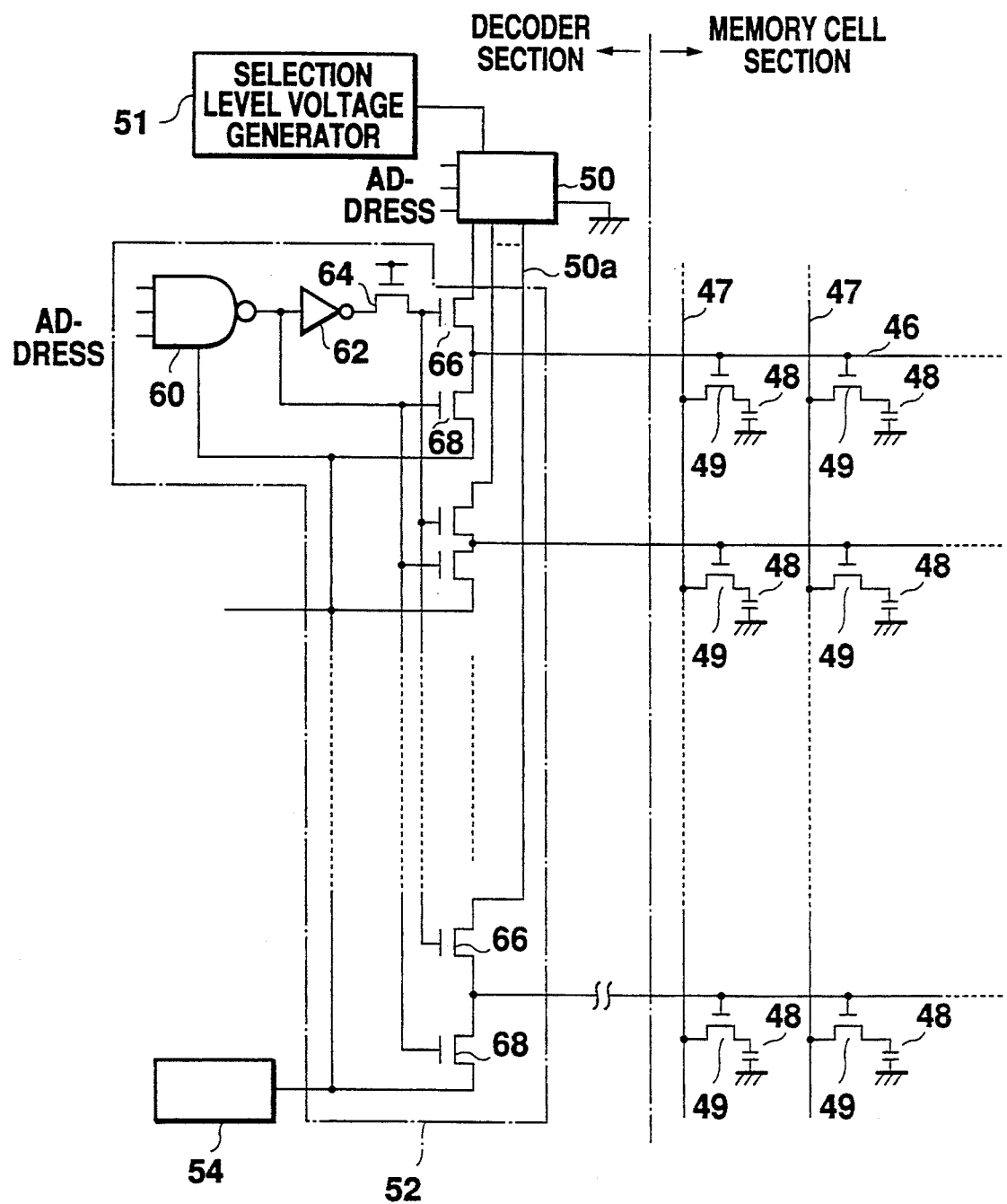
FIG. 4 is a partial circuit diagram of a dynamic random access memory according to one preferred embodiment of the invention.

FIG. 4 is a partial circuit diagram representing a dynamic random access memory according to the embodiment of the invention. The dynamic random access memory according to the embodiment operates at a low voltage such as 3.3 volts. The circuit portion shown in FIG. 4 is roughly divided into a memory cell section (shown on the right) and a decoder section (shown on the left) which decodes addresses and various control signals.

Figure 2:
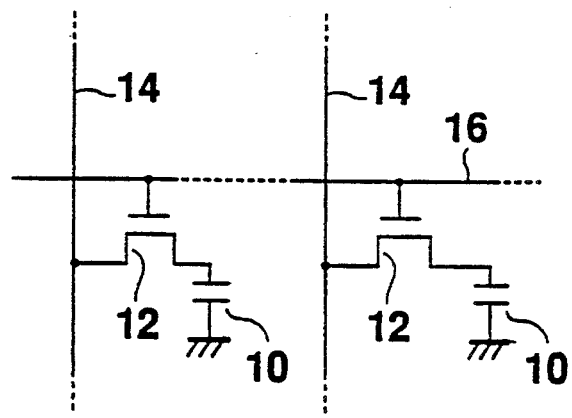
FIG. 2 is a circuit diagram representing memory cells of a conventional dynamic random access memory.

Each memory cell of the memory cell section is the same as the conventional memory cell shown in FIG. 2 in configuration. Pairs of cell capacitor 48 and transfer gate 49 are located as a matrix in the memory cell section. A plurality of word lines 46 and a plurality of bit lines 47 are connected to the pairs. That is, as many transfer gates 49 as the number of bit lines 47 are connected to one word line 46, and as many gates of the transfer gates as the number of word lines 46 are connected to one bit line 47. In FIG. 4, three word lines 46 and two memory cells 48 connected to each of the three word lines 46 via the transfer gates 49 are shown and others in the memory cell section are omitted in order to simplify the diagram.

Figure 1:
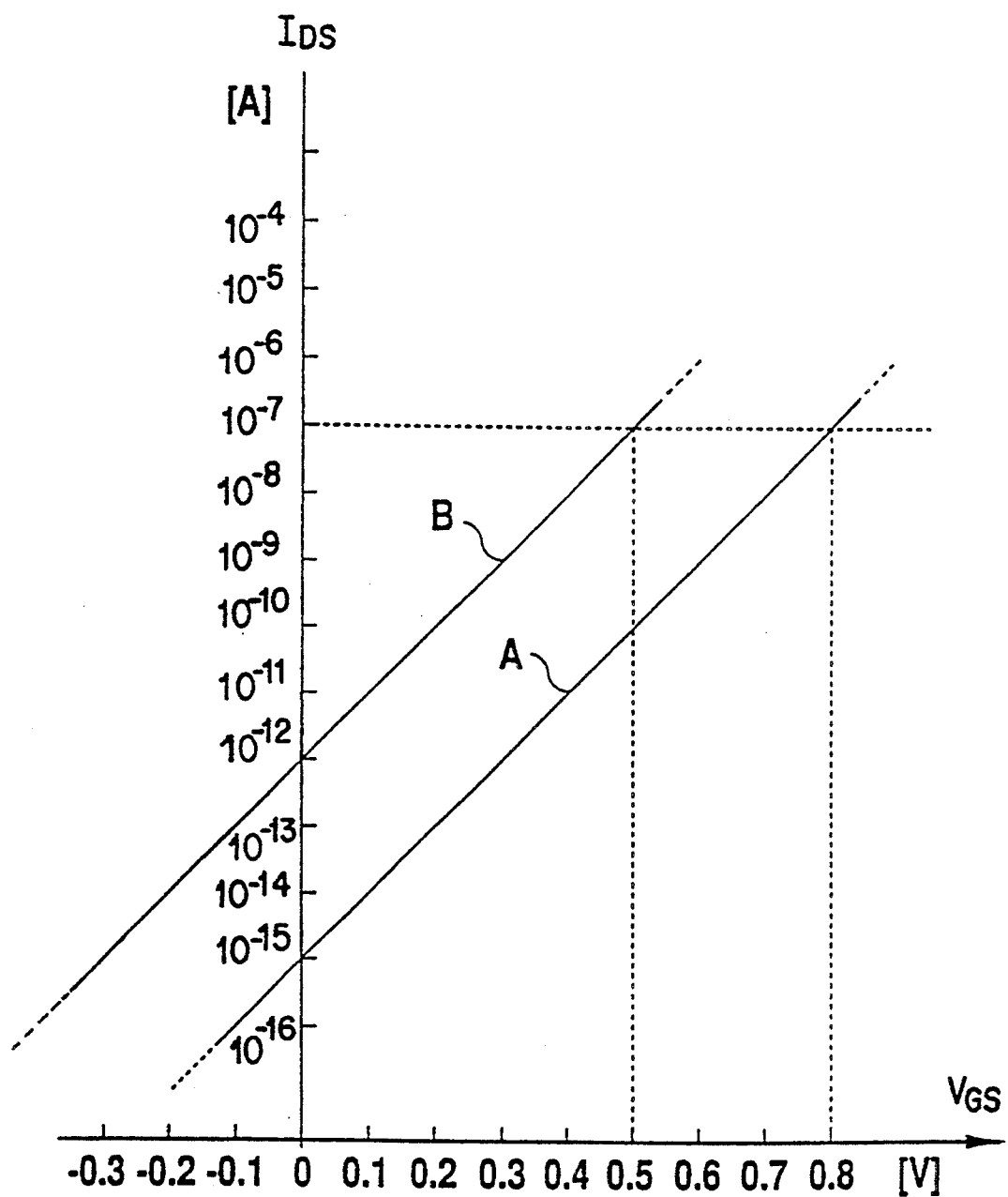
FIG. 1 is a graph representing the subthreshold characteristics of transistors.

Each transistor forming the transfer gate 49 at the memory cell according to the invention has Vth of about 0.5 volts which is lower by about 0.3 volts compared with the conventional semiconductor memory whose supply voltage is 5 volts. That is, the transistor has the characteristic indicated by B in FIG. 1.

On the other hand, the decoder section contains a lower address pre-decoder 50, word decoders 52, and a low voltage generator 54.

The lower address pre-decoder 50 decodes the predetermined bits, for example lower bits, of a memory access address and outputs signal 50a as one of inputs of word decoder 52, i.e. the inputs of word driver. The number of signal lines 50a equals the number of word lines 46 selected by one word decoder 52 (word lines controlled by the output of one word decoder). The lower address pre-decoder 50 sets only one signal line 50a that is selected in response to the lower address decoding result to a selection level voltage, and sets other signal lines 50a to a ground potential.

On the other hand, the low voltage generator 54 generates a nonselection level voltage signal. The nonselection level voltage is lower than ground potential Vss.

Each word decoder 52 has a NAND gate 60 to which a predecoded address signal (indicating a upper address) is input. If the input signal is a signal for selecting the word decoder, the NAND gate 60 outputs low; otherwise, it outputs high. An output from the low voltage generator 54 is supplied to the NAND gate 60, and the low voltage output from the low voltage generator 54 is a nonselection level voltage which is lower than ground potential Vss. A well known circuit which generates a low voltage is suitable as the low voltage generator 54 which generates the nonselection level voltage VL. For example, it is preferably made up of a charge pump circuit, etc.

The output signal of the NAND gate 60 is inverted by an inverter 62, and is further supplied via a transfer gate 64 to gate terminals of selection transistors 66. As many selection transistors 66 as the number of word lines 46 are provided.

The output signal of the NAND gate 60 is also supplied to nonselection transistors 68 directly. Like the selection transistors 66, as many nonselection transistors 68 as the number of word lines 46 are provided.

The selection transistors 66 and the nonselection transistors 68 are connected in series; drain of each selection transistor 66 is connected to one of the signal lines 50a and source is connected to drain of each nonselection transistor 68 and source of the nonselection transistor 68 is connected to output of the low voltage generator 54. The word lines 46 are connected to both the source of the selection transistors 66 and the drain of the nonselection transistors 68.

Therefore, the selection transistors 66 are switches for supplying the voltage of the signal lines 50a to the word lines 46 and the nonselection transistors 68 are switches for supplying the nonselection level voltage to the word lines 46.

As described above, the output signal of the NAND gate 60 is supplied directly to the nonselection transistors 68. The output signal of the NAND gate 60 is also inverted by the inverter 62, then supplied to the selection transistors 66, thus signals supplied to the nonselection and selection signals are opposite in phase. Therefore, only one or the other of the nonselection and selection transistors is turned on.

The operation of the semiconductor memory according to the embodiment will now be described in detail.

Figure 5:
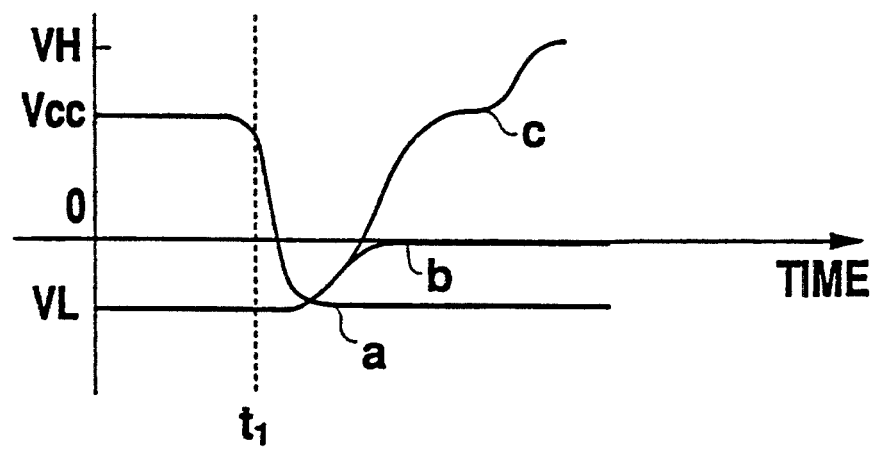
FIG. 5 is a chart representing signal waveforms of the parts of the dynamic random access memory shown in FIG. 4 when it is operating.

FIG. 5 shows signal waveforms of the nodes of word decoder, wherein the horizontal axis is time and the vertical axis is voltage.

First, the memory cell section is not selected until the time $t_1$. Up to this point an output signal of the NAND gate 60 is high. Thus, the nonselection transistors 68 to which the high output signal is applied are all turned on. On the other hand, the high output signal is also supplied to the selection transistors 66 via the inverter 62 and transfer gate 64. In fact, the output signal of the NAND gate 60 is inverted by the inverter 62 and the resultant low signal is applied to the selection transistors 66. Thus, the selection transistors 66 are off. As a result, a nonselection level voltage from the low voltage generator 54 is supplied via the nonselection transistors 68 to the word lines 46.

The nonselection level voltage is lower than the ground potential as shown in FIG. 5. That is, in the embodiment, the voltage is set to about −0.3 volts or less. Vth of the transfer gate 49 of each memory cell is set to 0.5 volts which is about 0.3 volts lower than Vth, 0.8 volts, of the conventional semiconductor memory driven at 5 volts, as described above. Since −0.3 volts is applied as the gate voltage, its subthreshold current becomes $10^{-15}$ A as seen in B in FIG. 1. This value is substantially the same as the subthreshold current value when the conventional transistor whose Vth is 0.8 volts is operated at 5 volts.

Thus, even if Vth of the transfer gate 49 is lowered in order to operate at the low supply voltage, the embodiment enables leakage current to be suppressed to as small a value as that in the conventional memory cell operating at the high voltage of 5 volts. In the description that follows, the nonselection level voltage is referred to as VL.

Next, in the example in FIG. 5, when the time $t_1$ passes, one of the word decoders 52 is selected, and the output signal of the NAND gate 60 goes low. Thus, the nonselection transistors 68 which are on are turned off, and in contrast, the selection transistors are turned on. As a result, a voltage from the lower address decoder 50 rather than the voltage from the low voltage generator 54 is supplied to the word lines 46 of selected word decoders. As described above, the lower address decoder 50 decodes a lower address and then supplies the selection level voltage to any one selection transistor 66 selected in response to the decoding result, and supplies a ground potential signal to other unselected selection transistors.

Figure 6:
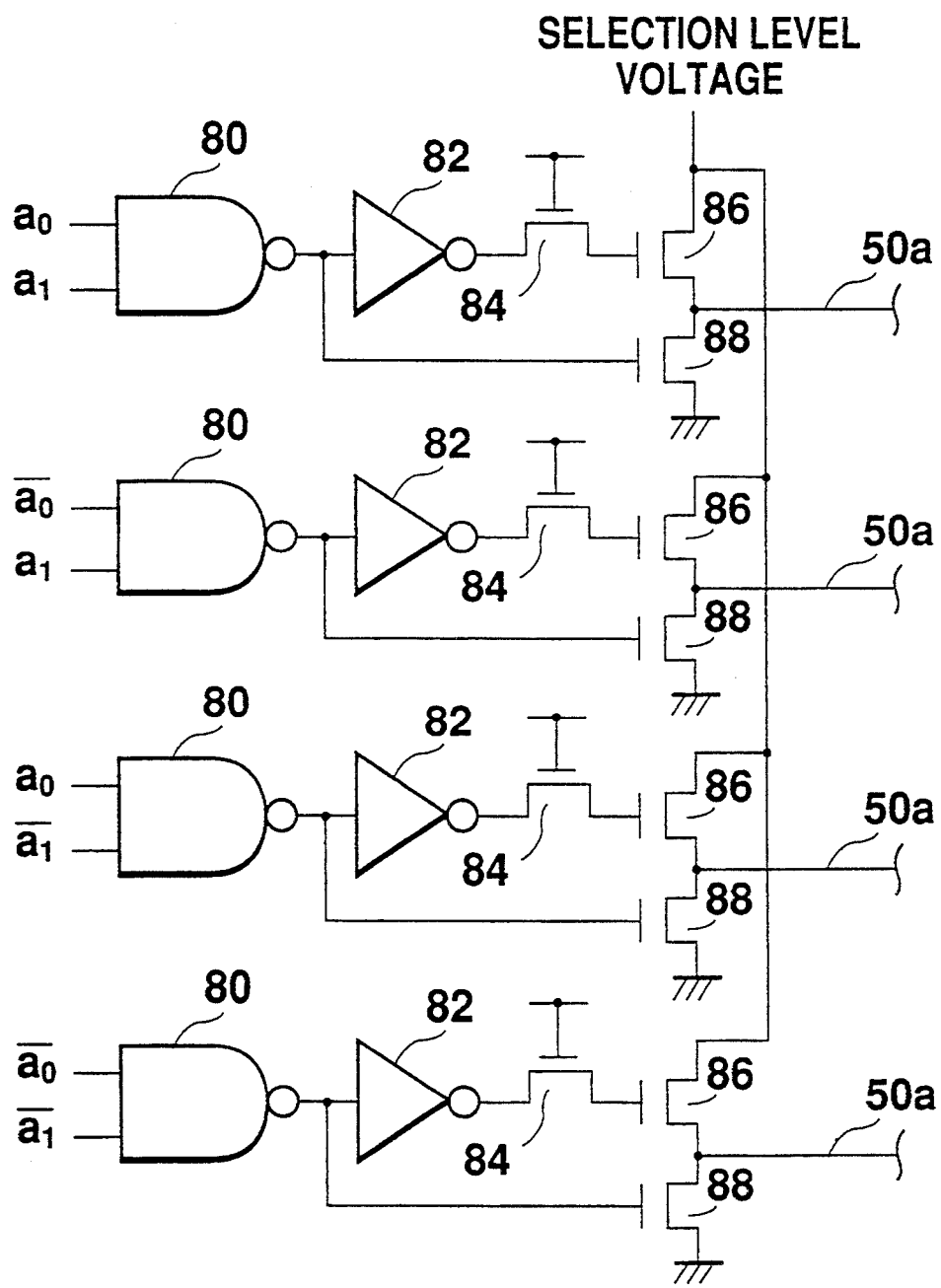
FIG. 6 is a block diagram showing a configuration example of a lower address pre-decoder.

The lower address pre-decoder 50 has a configuration as shown in FIG. 6. It consists of NAND gates 80, inverters 82, transfer gates 84, and pairs of transistors 86 and 88. An output of each NAND gate 80 is supplied via its respective inverter 82 and transfer gate 84 to the gate of its associated transistor 86. On the other hand, the output of the NAND gate is directly supplied to the gate of the transistor 88. Therefore, the signals supplied to the gates of the transistors 86 and 88 are high and low or low and high, turning on one or other of the transistors 86 and 88. An output of the selection level voltage generator 51 is connected to drain of the transistor 86 and source end of the transistor 86 is connected to drain of the transistor 88 and source end of the transistor 88 is grounded. The connection point of the transistors 86 and 88 is connected to a word line control signal line 50a. Thus, any one of the signal lines 50a, which are outputs of the lower address pre-decoder 50, is set to the selection level voltage and others are set to the ground potential. In the example in FIG. 6, a 2-bit input is decoded. The lower two bits of an address, a0 and a1, are input and one of the four signal lines 50a goes high level.

The lower address pre-decoder 50 decodes a given lower address, then applies the selection level voltage to the selected signal line 50a and sets other lines 50a to the ground potential. Therefore, the selection transistor 66 to which is selected then applies the high level voltage to its corresponding word line 46. Thus, the potential of the word line 46 rises to the selection level voltage, as shown in c in FIG. 5. On the other hand, the transistor 66 to which the ground voltage is applied then applies the ground voltage to its corresponding word line 46. Thus, the potential of the word line 46 rises to the ground level, as shown in b in FIG. 5.

When a word decoder 52 is not selected, the NAND gate 60 of the word decoder 52 does not output low, then the selection transistors 66 are off and the nonselection transistors 68 are on and the word lines 46 remain at the nonselection level voltage which is lower than the ground potential, thus the leakage current of the memory cell can be sufficiently suppressed.

The transfer gates 49 connected to the selected word line 46 are turned on and the cell capacitor 48 connected to the transfer gates 49 are accessed.

The selected word line 46 may also be raised to the selection level voltage after it is once raised to the ground potential or a voltage slightly higher than the ground potential (a voltage lower than the threshold voltage). This can be easily accomplished by controlling the potentials set in the selection level voltage generator 51.

As described above, according to the embodiment, the nonselection level voltage of the voltage VL lower than the ground potential from the low voltage generator 54 is supplied to the word lines 46 connected to the transfer gate of unselected memory cells. Therefore, even in a semiconductor memory where the supply voltage is lowered and Vth is lowered accordingly, the leakage current can be suppressed to a small value according to the embodiment. This can prevent such trouble that the refresh period must be shortened because of cell leakage current. In the case of dynamic random access memory with the auto-refresh function, the number of refresh cycle in the standby mode can be reduced and a semiconductor memory with small consumption current can be provided.

Figure 3:
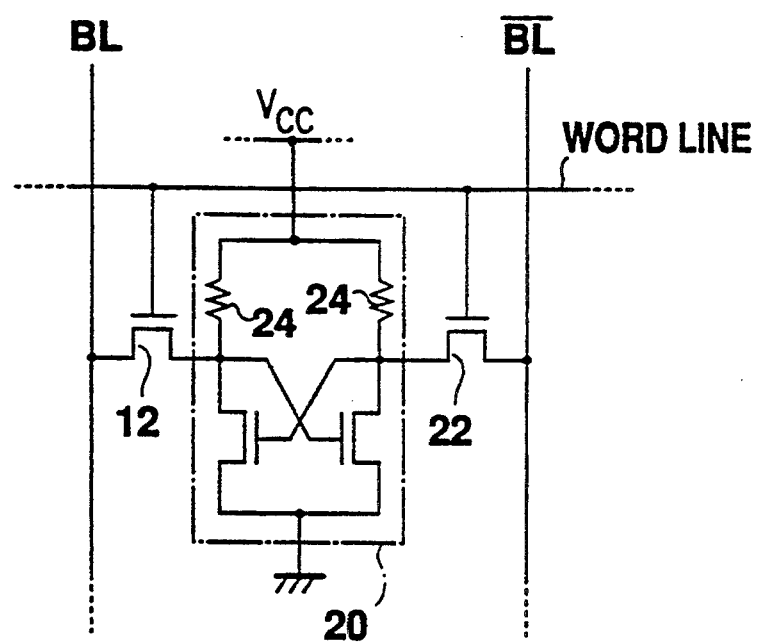
FIG. 3 is a circuit diagram representing a memory cell of a conventional static random access memory.

In the embodiment, the dynamic random access memory is taken as an example, but the invention is also applicable to a static random access memory, in which case each memory cell in the embodiment should be replaced with the static memory cell shown in FIG. 3 and the lower address decoder should be made static.

If the flip-flop shown in FIG. 3 is used for each memory cell, a static random access memory can be configured and the leakage current can be suppressed to a small value as with the embodiment. Therefore, even if the load resistance value of the flip-flop constructing the memory cell remains the same as the conventional value, a semiconductor memory with a lower soft error rate induced by a particles, etc., can be provided. Since the leakage current can be decreased, as with the dynamic random access memory, the load resistance can be higher, the cell current can be made small, and the current in the standby mode can be decreased, thus a semiconductor memory with small consumption current during no operation can be provided.

What is claimed is:

1. A semiconductor memory responsive to an address signal for controlling potentials of a plurality of word lines to control an access to the memory, said semiconductor memory comprising:
    a plurality of transfer gates connected to each of said plurality of word lines, wherein when a signal on a word line has a selection level voltage, the transfer gates connected to the word line are turned on and when said signal on said word line has one of a first nonselection level voltage and a second nonselection level voltage, the transfer gates connected to the word line are turned off;
    a plurality of memory elements each connected to one of said plurality of transfer gates, wherein a state of each of said plurality of memory elements is controlled by the transfer gate to which the memory element is connected;
    means for generating said selection level voltage;
    means for generating said first nonselection level voltage, wherein the first nonselection level voltage is sufficiently lower than a ground potential to minimize a leakage current from the memory elements; and
    decoder means for supplying said selection level voltage to a selected word line specified by said address signal and for selectively supplying said first and second nonselection level voltages to other word lines.

2. The semiconductor memory as claimed in claim 1 wherein a supply voltage of said semiconductor memory is a voltage lower by a predetermined potential than a supply voltage used with a conventional semiconductor memory.

3. The semiconductor memory as claimed in claim 2, wherein a threshold voltage of a transistor used for said transfer gate is set lower than that of a transistor used for a transfer gate used with a conventional semiconductor memory by a difference, the difference being a drop voltage.

4. A semiconductor memory responsive to an address signal for controlling potentials of a plurality of word lines to access the memory, said semiconductor memory comprising:
    a supply voltage of said semiconductor memory having a voltage lower by a predetermined potential than a supply voltage used with a conventional semiconductor memory;
    a plurality of transfer gates connected to each of said plurality of word lines, wherein when a signal on a word line has a selection level voltage, the transfer gates connected to the word line are turned on and when said signal on said word line has a nonselection level voltage, the transfer gates connected to the word line are turned off;
    a threshold of the plurality of transfer gates being lower than a threshold of a conventional transfer gate;
    a plurality of memory elements each connected to one of said plurality of transfer gates, wherein a state of each of said plurality of memory elements is controlled by the transfer gate to which the memory element is connected;
    means for generating said selection level voltage;
    means for generating said nonselection level voltage, wherein said nonselection level voltage is sufficiently lower than a ground potential to minimize a leakage current from the memory elements and is set to a voltage lower than the ground potential by an amount corresponding to a drop voltage value of said threshold voltage of said transfer gate; and
    decoder means for supplying said selection level voltage to a selected word line specified by said address signal and for supplying said nonselection level voltage to other word lines.

5. The semiconductor memory device of claim 4, wherein said decoder means includes a plurality of word decoders and a lower address pre-decoder,
    said lower address pre-decoder supplying said selection level voltage to a signal line corresponding to a word line selected according to lower bits of said address signal and supplying the ground potential to other signal lines;
    each of said word decoders, when selected according to upper bits of said address signal, supplying the voltage of the signal lines from said lower address pre-decoder to said plurality of word lines corresponding to said word decoder, and, when not selected, supplying said nonselection level voltage to said plurality of word lines.

6. A semiconductor memory device operating with a lower supply voltage than conventional semiconductor memory devices, the memory device responsive to an address signal for controlling voltage potentials on a plurality of word lines, the word lines controlling access to the memory device, said semiconductor memory device comprising:
    a plurality of transfer gates having a lower threshold voltage than a threshold voltage of a conventional transfer gate, the difference being a drop voltage, each transfer gate being connected to one of said plurality of word lines, each transfer gate being turned ON when a signal on said one word line is at a selection level voltage, and each transfer gate being turned OFF when a signal on said one word line is at a nonselection level voltage;

a plurality of memory elements connected to said plurality of transfer gates, a state of each memory element controlled by the respective transfer gate;

a first voltage generator generating said selection level voltage;

a second voltage generator generating said nonselection level voltage, wherein the nonselection level voltage is lower than a ground potential by an amount corresponding to the drop voltage; and a decoder decoding the address signal to supply the selection level voltage to said one word line and the nonselection level voltage to other word lines.

7. The semiconductor memory device of claim 6, wherein said decoder further comprises:

a lower address pre-decoder supplying the selection level voltage to a signal line corresponding to a word line selected according to lower bits of the address signal, and supplying the ground potential to other signal lines; and a plurality of word decoders supplying the selection level voltage, ground potential and the nonselection level voltage to the word lines, each of the word decoders, when selected according to upper bits of said address signal, supplying the voltage of the signal lines from said lower address pre-decoder to said plurality of word lines corresponding to said word decoder, and, when not selected, supplying said nonselection level voltage to said plurality of word lines.

8. The semiconductor memory device of claim 6, wherein the lower supply voltage is approximately +3.3 volts.

9. The semiconductor memory device of claim 6, wherein the drop voltage is approximately −0.3 volts.

10. The semiconductor memory device of claim 6, wherein the threshold voltage of the transfer gate is approximately +0.5 volts.

11. The semiconductor memory according to claim 1, wherein the decoder means comprises:

a plurality of first decoders, each first decoder connected to a subplurality of word lines; and a second decoder connected to each word line of each subplurality of word lines, wherein:

one of the plurality of first decoders is selected by the address signal, the corresponding subplurality of word lines of the selected first decoder being connected to the second decoder, at least one of the first plurality of first decoders is not selected by the address signal, the at least one corresponding subplurality of word lines of the at least one nonselected first decoder being connected to the first nonselection voltage generating means, the selected one of the subplurality of word lines of the selected second decoder being supplied with the selection level voltage by the second decoder, and nonselected one of the subplurality of word lines of the selected second decoder being supplied with the second nonselection level voltage by the second decoder.

* * * * *